(12) United States Patent
Parton et al.

(10) Patent No.: US 6,849,345 B2
(45) Date of Patent: Feb. 1, 2005

(54) ORGANIC ELECTROLUMINESCENT DEVICES WITH HIGH LUMINANCE

(75) Inventors: Richard L. Parton, Webster, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 31 days.

(21) Appl. No.: 10/145,363

(22) Filed: May 14, 2002

(65) Prior Publication Data

US 2003/0129449 A1 Jul. 10, 2003

Related U.S. Application Data

(63) Continuation-in-part of application No. 09/966,278, filed on Sep. 28, 2001, now abandoned.

(51) Int. Cl.[7] .................. H05B 33/12; C07C 211/58
(52) U.S. Cl. ............... 428/690; 428/917; 313/504; 313/506; 564/428; 564/429; 564/434
(58) Field of Search ............... 428/690, 917; 313/504, 506; 564/426, 427, 428, 429, 434

(56) References Cited

U.S. PATENT DOCUMENTS

| | | | | |
|---|---|---|---|---|
| 5,759,444 | A | * 6/1998 | Enokida et al. | ........ 252/301.16 |
| 5,935,721 | A | * 8/1999 | Shi et al. | .............. 428/690 |
| 2002/0168543 | A1 | * 11/2002 | Ishikawa et al. | ............ 428/690 |

FOREIGN PATENT DOCUMENTS

| EP | 0 891 121 | 1/1999 |
|---|---|---|
| EP | 0 924 192 A1 | * 6/1999 |
| EP | 1 029 909 | 8/2000 |
| JP | 11-273860 | 10/1999 |

OTHER PUBLICATIONS

Selby et al., "Naphthyldiamine Diradical Dications. Triplet Dications of 2,7–Bis(amino)napthalene and 2,7–Bis(phenylenediamino)naphthalene", vol. 121, pp. 7152–7153, published on Web Jul. 20, 1999.*

* cited by examiner

Primary Examiner—Marie Yamnitzky
(74) Attorney, Agent, or Firm—Arthur E. Kluegel

(57) ABSTRACT

Disclosed is a multilayer electroluminescent device comprising a cathode, an anode, a light emitting layer (LEL) and a layer disposed between the cathode and anode containing a naphthalene compound represented by formula (1):

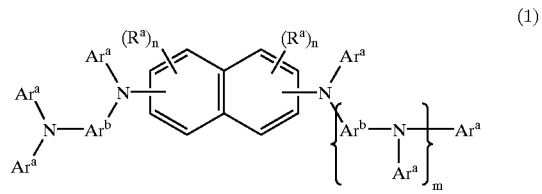

wherein
  m is 0, 1 or 2;
  each $R^a$ is an independently selected substituent and each n is independently 0 to 3;
  each $Ar^a$ is an independently selected aromatic group; and
  each $Ar^b$ is an independently selected carbocyclic aromatic group;
  provided that two ring substituents may join to form a ring.

The device provides a desired high luminance.

25 Claims, 1 Drawing Sheet

ORGANIC ELECTROLUMINESCENT DEVICES WITH HIGH LUMINANCE

CROSS REFERENCE TO RELATED APPLICATION

This application is a Continuation-in-Part of U.S. Ser. No. 09/966,278 filed Sep. 28, 2001, now abandoned the contents of which are incorporated herein by reference.

FIELD OF THE INVENTION

This invention relates to organic electroluminescent devices. More specifically, this invention relates to devices that emit light from a current-conducting organic layer and have high luminance.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. The organic layers in these devices, usually composed of a polycyclic aromatic hydrocarbon, were very thick (much greater than 1 $\mu$m). Consequently, operating voltages were very high, often >100V.

Herein, the term "EL element" encompasses the layers between the anode and cathode. Recent organic EL devices include an organic EL element consisting of extremely thin layers (e.g. <1.0 $\mu$m) between the anode and the cathode. Reducing the thickness lowers the resistance of the organic layer and has enabled devices that operate using much lower voltage. In a basic two-layer EL device structure, described first in U.S. Pat. No. 4,356,429, one organic layer of the EL element adjacent to the anode is specifically chosen to transport holes; therefore, it is referred to as the hole-transporting layer (HTL). The other organic layer is specifically chosen to transport electrons, and is referred to as the electron-transporting layer (ETL). The interface between the two layers provides an efficient site for the recombination of the injected hole/electron pairs which results in light emission.

Additional layers have been proposed to further improve device performance, e.g., as described in U.S. Pat. No. 4,769,292. This discloses the concept of an organic light-emitting layer (LEL) between the HTL and ETL, and the concept of a hole-injecting layer (HIL) located between the anode and the HTL.

Materials comprising porphyrinic compounds have been disclosed by Tang in U.S. Pat. No. 4,356,429 for use in the HTL. Further improvements in device performance are taught in U.S. Pat. Nos. 4,539,507, 4,720,432, and 5,061,569 where the hole-transporting layer utilizes an aromatic tertiary amine.

Since these early inventions, further improvements in hole-transporting and other device materials have resulted in improved device performance in attributes such as color, stability, luminance efficiency and manufacturability, e.g., as disclosed in U.S. Pat. Nos. 5,061,569, 5,409,783, 5,554,450, 5,593,788, 5,683,823, 5,908,581, 5,928,802, 6,020,078, and 6,208,077, amongst others. EP 891,121 and EP 1.029,909 suggest the use of biphenylene and phenylene diamine derivatives to improve hole injecting and/or transporting and JP 11-273830 suggests the use of naphthyldiamine derivatives in EL elements generally.

Notwithstanding these developments, there are continuing needs for organic EL device components that will provide a desired high luminance.

SUMMARY OF THE INVENTION

The invention provides a multilayer electroluminescent device comprising a cathode, an anode, a light emitting layer (LEL) and a layer disposed between the cathode and anode containing a naphthalene compound represented by formula (1):

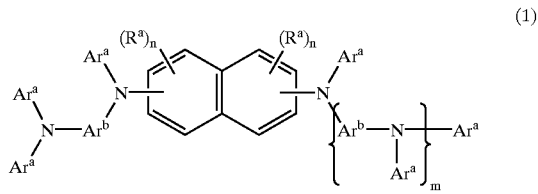

(1)

wherein
  m is 0, 1 or 2;
  each $R^a$ is an independently selected substituent and each n is independently 0 to 3;
  each $Ar^a$ is an independently selected aromatic group; and
  each $Ar^b$ is an independently selected carbocyclic aromatic group;
  provided that two ring substituents may join to form a ring.

The invention also provides a multilayer electroluminescent device comprising a cathode, an anode, a light emitting layer (LEL) and a layer disposed between the cathode and anode containing a naphthalene compound represented by formula (1'):

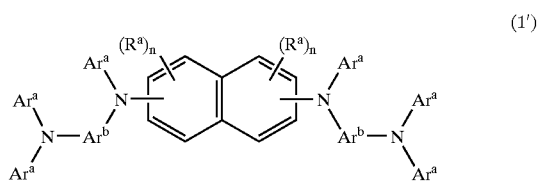

(1')

wherein
  each $R^a$ is an independently selected substituent and each n is independently 0 to 3;
  each $Ar^a$ is an independently selected aromatic group; and
  each $Ar^b$ is an independently selected carbocyclic aromatic group;
  provided that two ring substituents may join to form a ring.

The invention also provides a naphthalene compound and an imaging device containing the EL device of the invention.

DETAILED DESCRIPTION OF THE INVENTION

Figure 1:
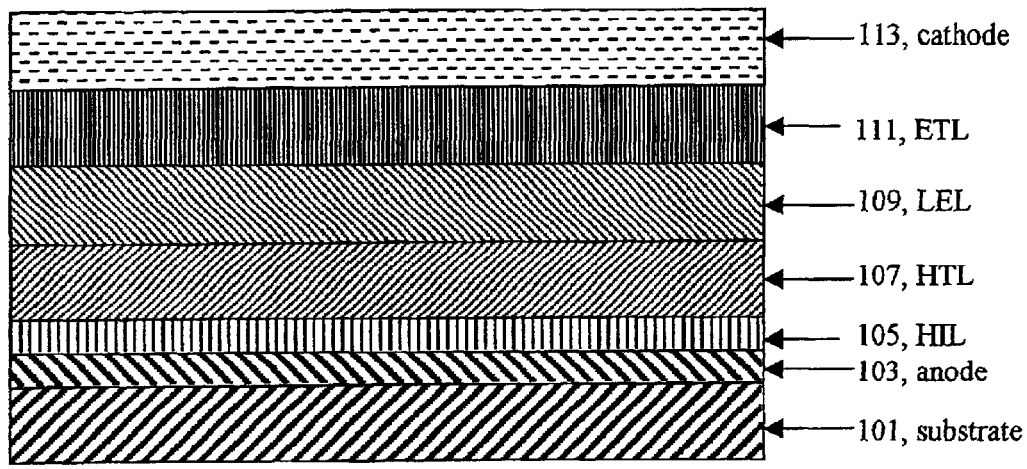
FIG. 1 is a schematic diagram showing a cross-section of a first organic EL device of the invention.

The EL device of the invention is generally as described above. In one preferred embodiment the EL device contains at least one naphthalene compound described in Formula (1).

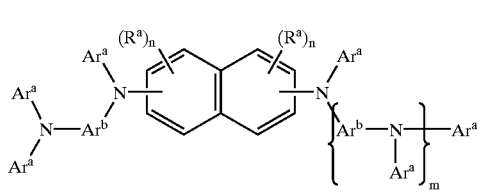

(1)

wherein m is 0, 1 or 2;

each $R^a$ is an independently selected substituent and each n is independently 0 to 3;

each $Ar^a$ is an independently selected aromatic group; and each $Ar^b$ is an independently selected carbocyclic aromatic group;

provided that two ring substituents may join to form a ring.

Desirably, the naphthalene compound is a diamino compound such as a 1,5-di-amino compound or a 2,6 di-amino compound. Suitable examples of groups useful as $Ar^a$ are phenyl, tolyl, and naphthyl groups. Suitable examples of groups useful as $Ar^b$ are phenyl and naphthyl groups.

In one preferred embodiment the EL device contains at least one naphthalene compound described in Formula (1').

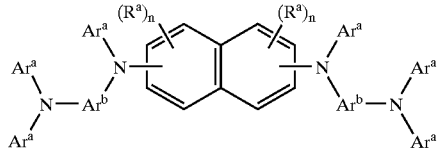

(1')

wherein each $R^a$ is an independently selected substituent and each n is independently 0 to 3, each $Ar^a$ is an independently selected aromatic group; and each $Ar^b$ is an independently selected carbocyclic aromatic group;

provided that two ring substituents may join to form a ring.

Desirably, the naphthalene compound is a 1,5-di-amino compound or a 2,6 di-amino compound. Desirably at least one $R^a$ group is an alkyl or aryl group such as a methyl, phenyl, naphthyl, or pyridyl group. Suitable examples of groups useful as $Ar^b$ are phenyl and naphthyl groups. Suitably, at least one $Ar^b$ is a para-substituted phenyl group.

The device is not limited as to the other materials used in the EL device. The LEL of the device typically contains a metal complex of a quinoline derivative, such as tris(8-quinolinolato)aluminum (III) (AlQ₃). Alternatively, it may contain a compound having the formula:

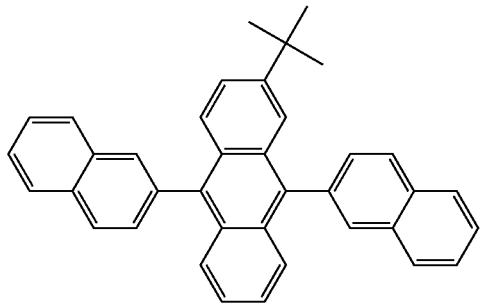

Dopants are also commonly employed in the LEL layers.

In one embodiment, the naphthalene compound useful in the device is represented by formula (1A):

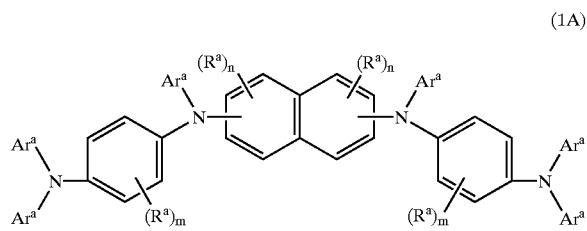

(1A)

wherein each $Ar^a$, $R^a$, and n are as defined for formula (1') and each m is independently 0–4. In another embodiment, the naphthalene compound is represented by formula (1B):

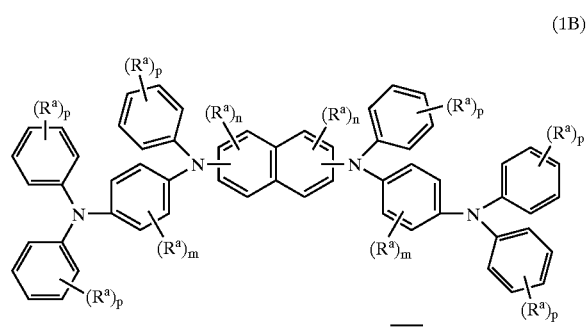

(1B)

wherein each $R^a$, m, and n are as defined above and each p is independently 0–5.

The naphthalene compound is usually contained in a layer between the anode and the LEL. That layer may or may not be adjacent to the anode. In some embodiments of the invention, it is desirable that the compound is not adjacent to the LEL. The naphthalene compound useful in the invention is effective to improve the luminance efficiency of the EL device. It is believed that the naphthalene compound functions to improve hole-transporting properties of the layer in which it resides, and there is a further improvement when there is present in a layer between the anode and LEL a second compound that functions to improve hole transporting.

A suitable second compound is represented by formula (C):

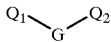

C wherein $Q_1$ and $Q_2$ are independently selected aromatic tertiary amine moieties and G is a linking group or a bond.

An example of the second compound is 4,4'-Bis[N-(2-naphthyl)-N-phenylamino]biphenyl. Suitably, the compound of formula C is contained in the layer adjacent to the LEL.

The EL device of the invention is desirably used as a component in a static or motion imaging device, such as a television, cell phone, DVD player or computer monitor.

Illustrative examples of naphthalene compounds useful in the present invention are the following:

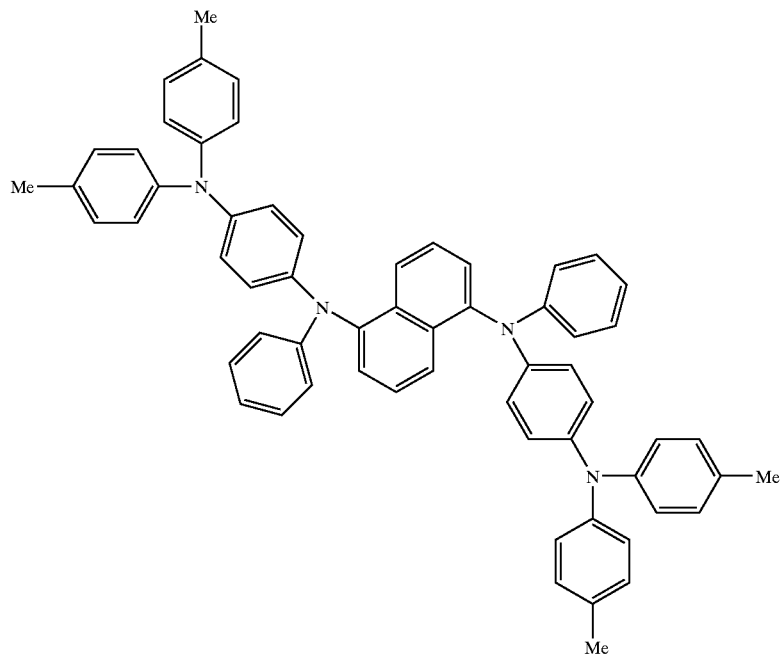

Inv-1

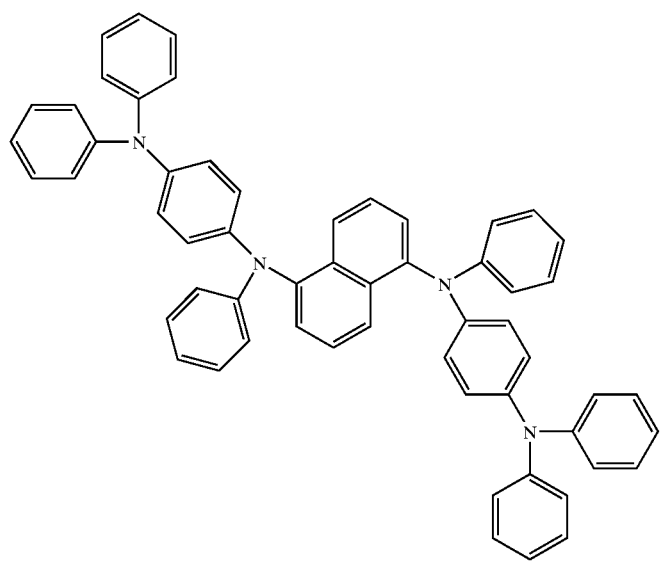

Inv-2

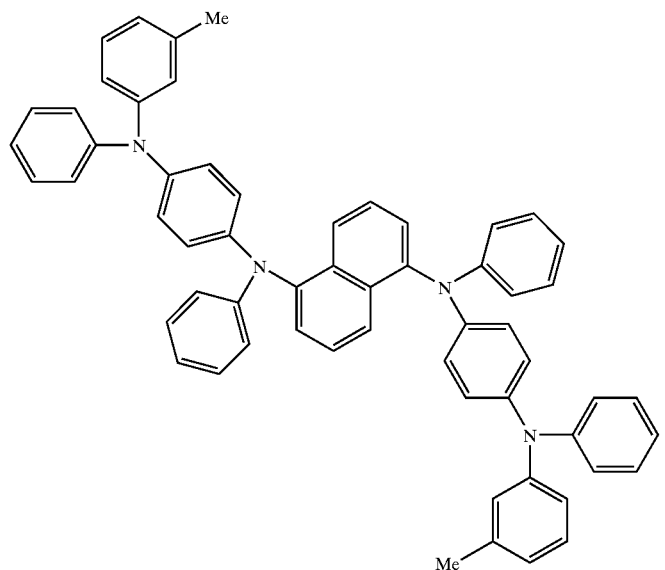
Inv-3
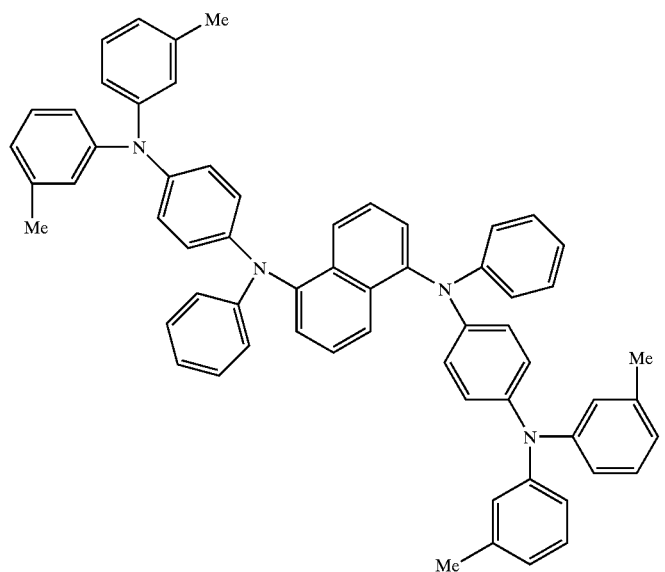
Inv-4

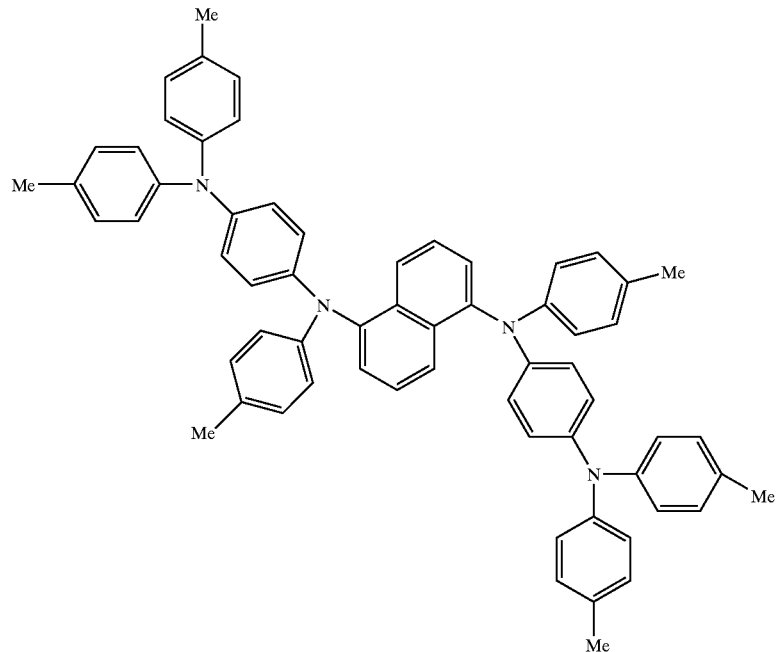
Inv-5
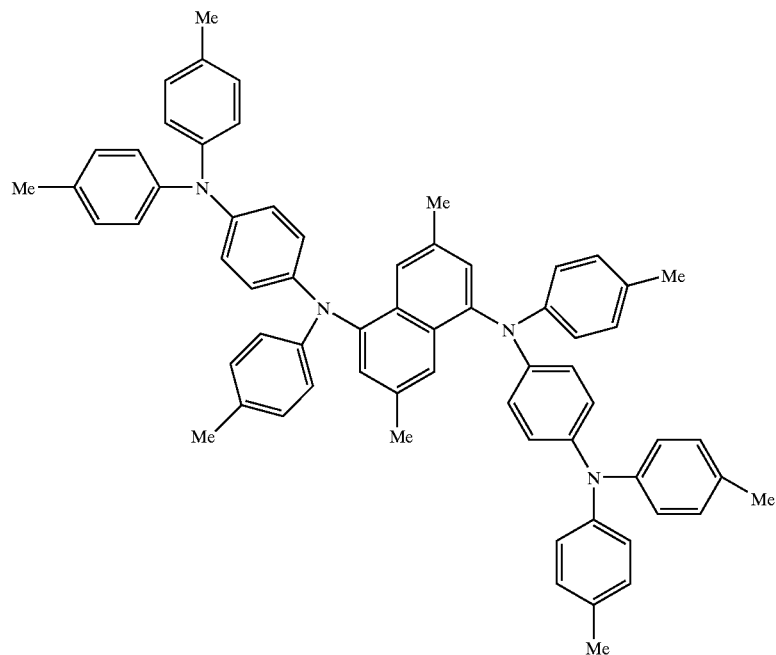
Inv-6

Inv-7
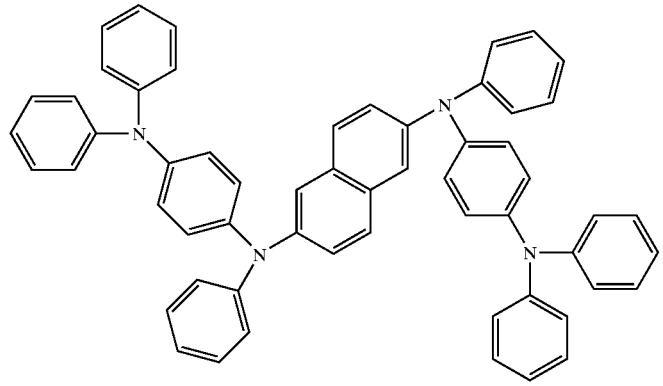
Inv-8
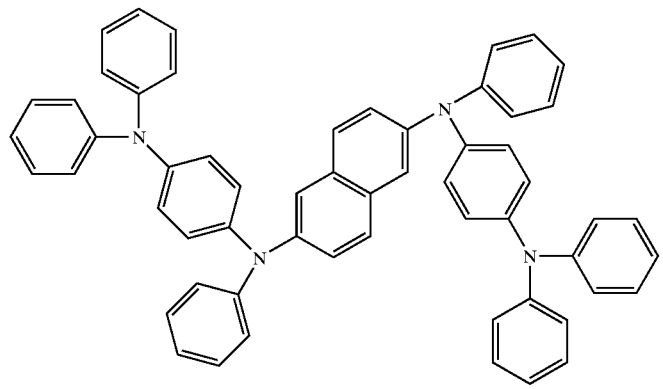
Inv-9
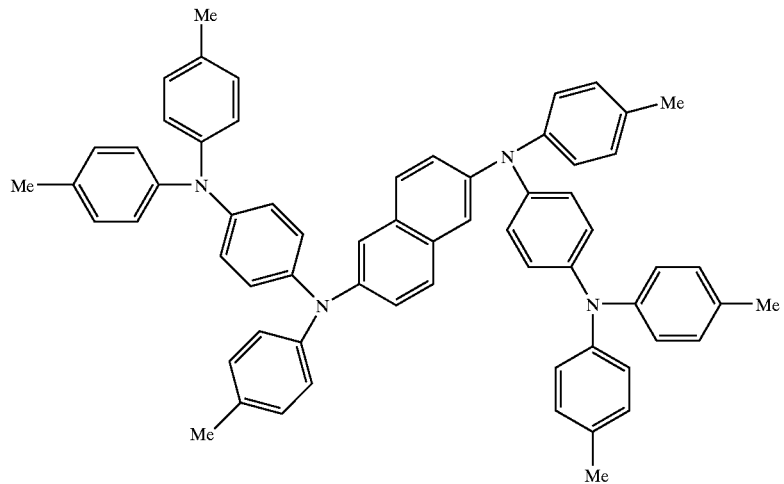
Inv-10
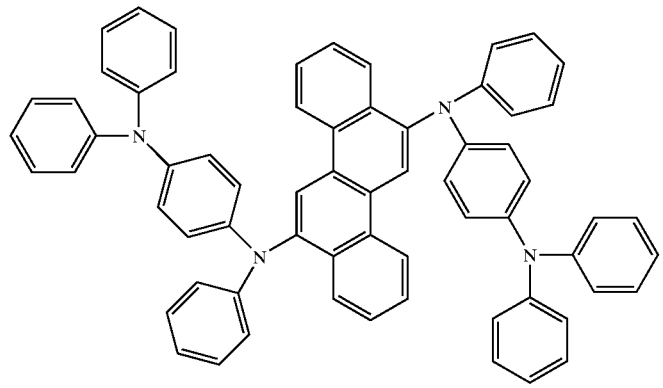

-continued
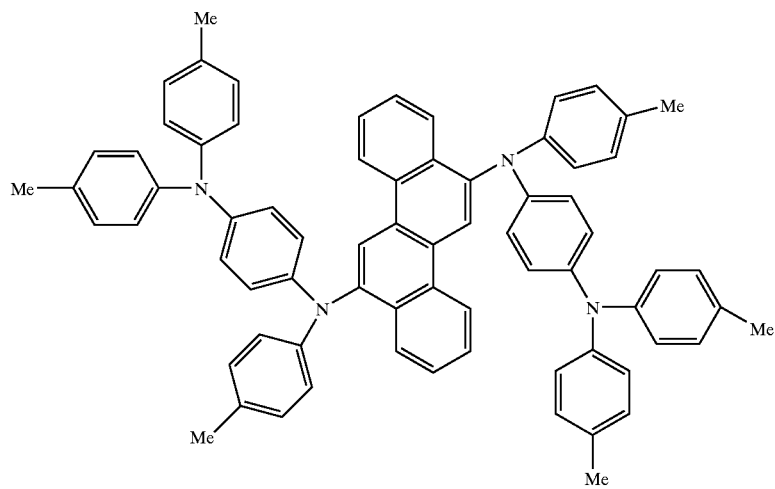
Inv-11
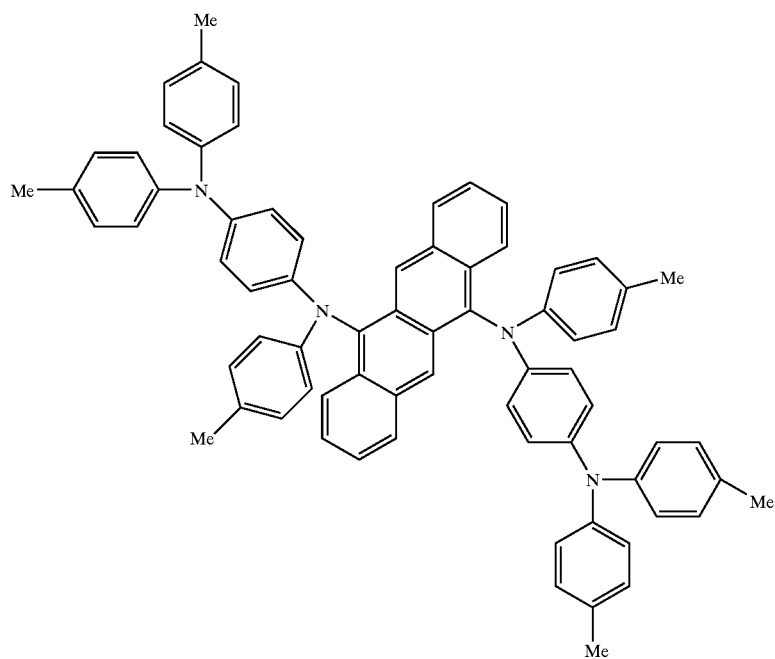
Inv-12
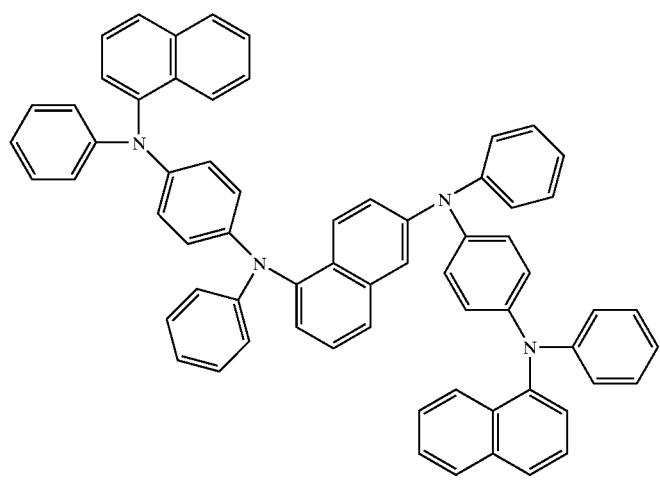
Inv-13

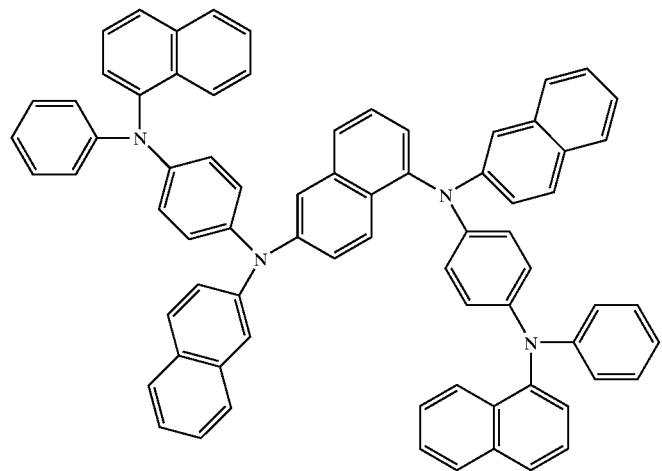
Inv-14
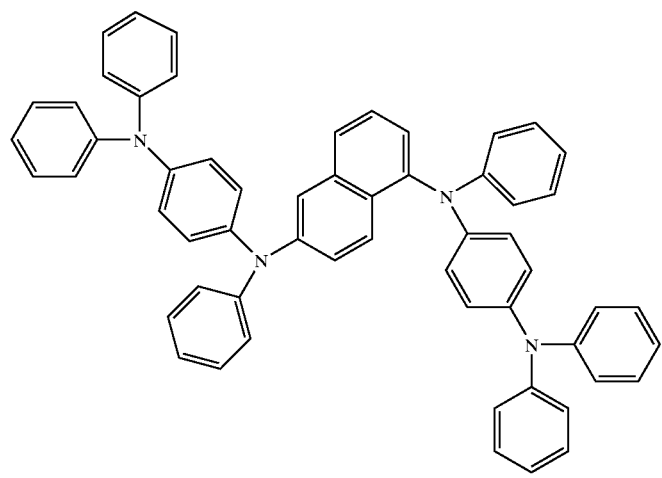
Inv-15
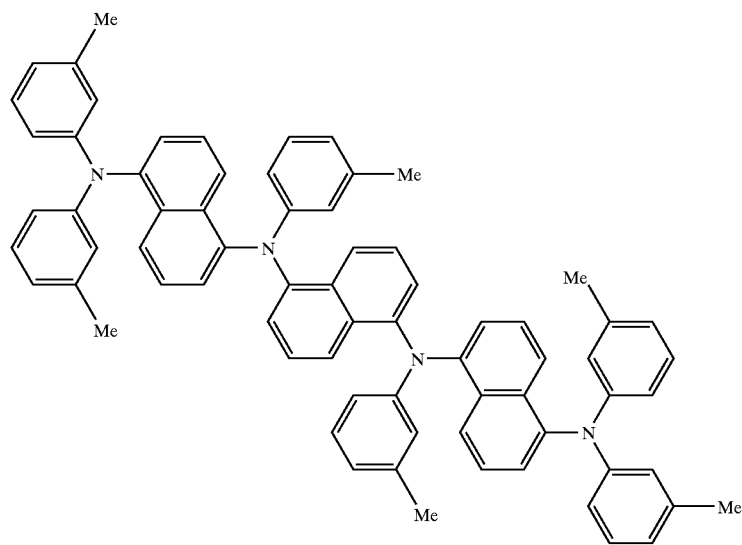
Inv-16

-continued
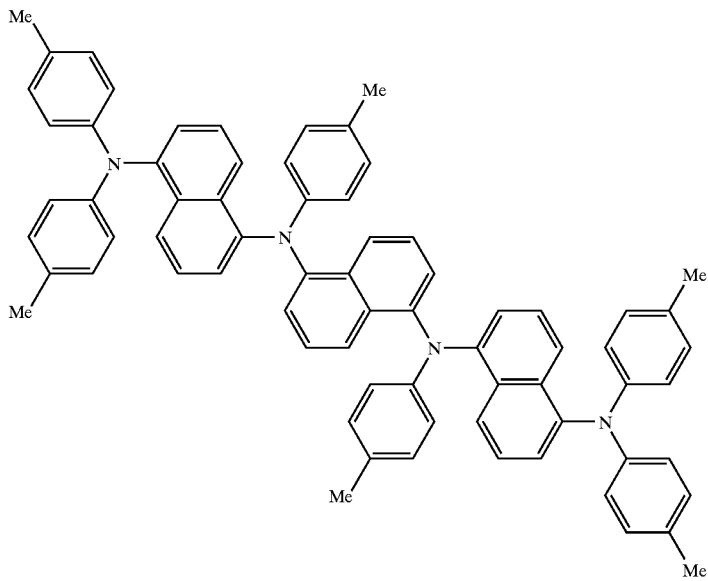
Inv-17
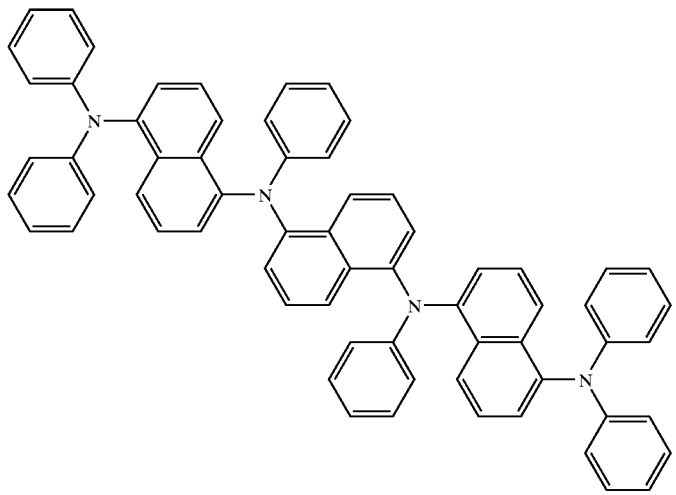
Inv-18
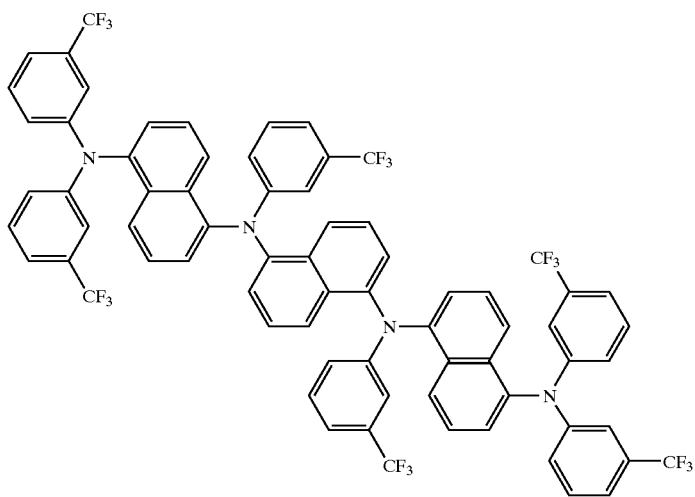
Inv-19

-continued
Inv-20
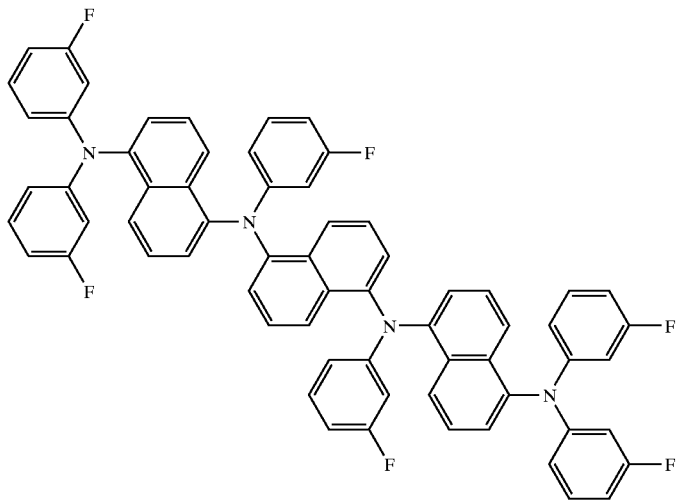
Inv-21
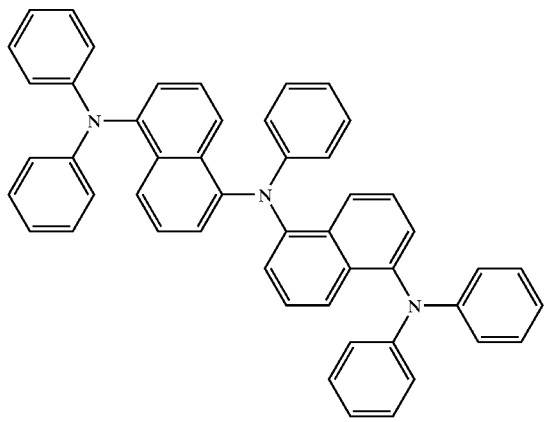
Inv-22
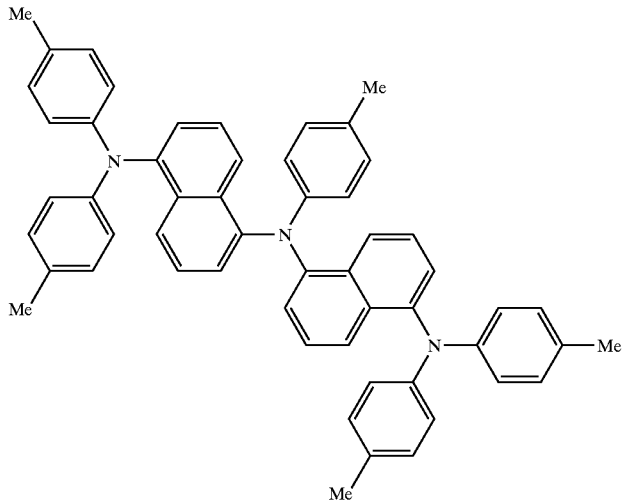

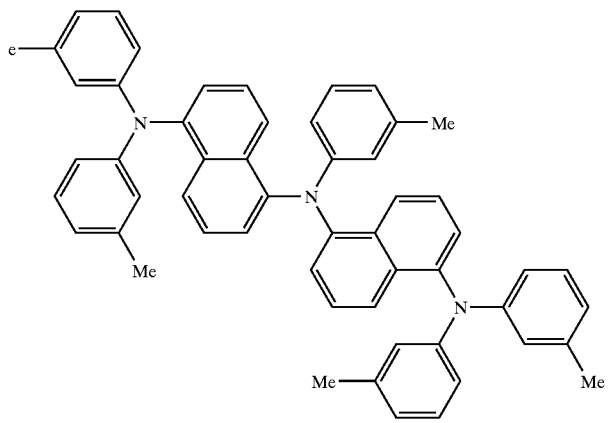
Inv-23
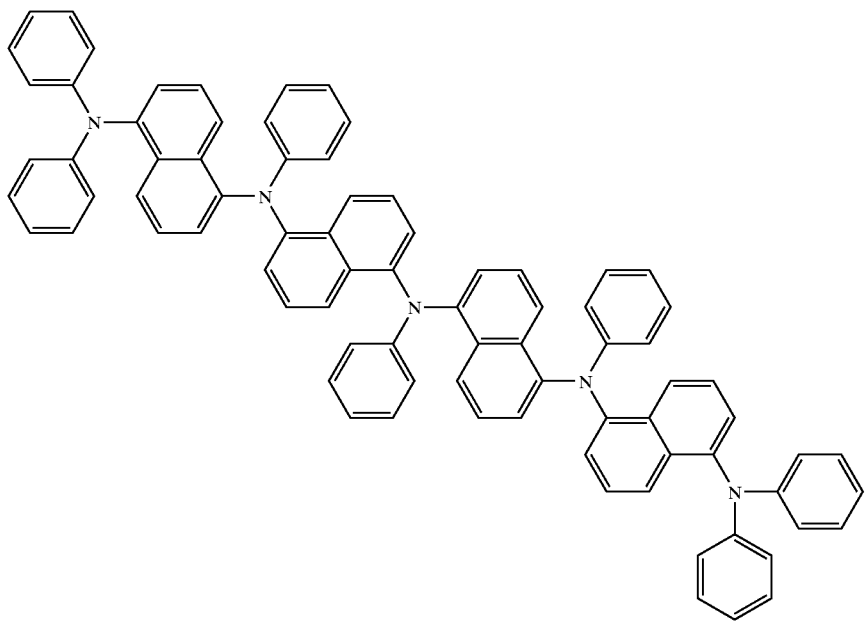
Inv-24
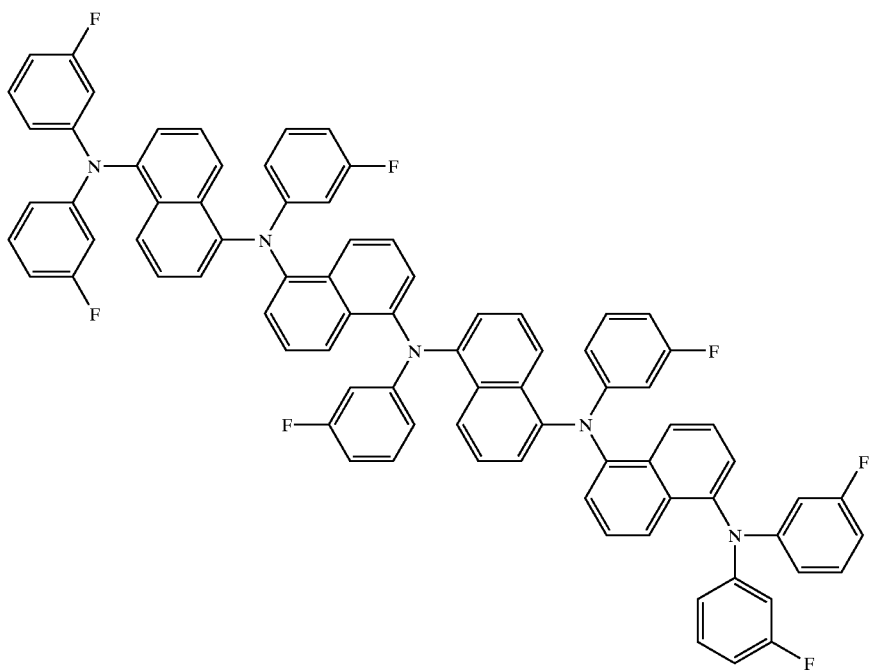
Inv-25

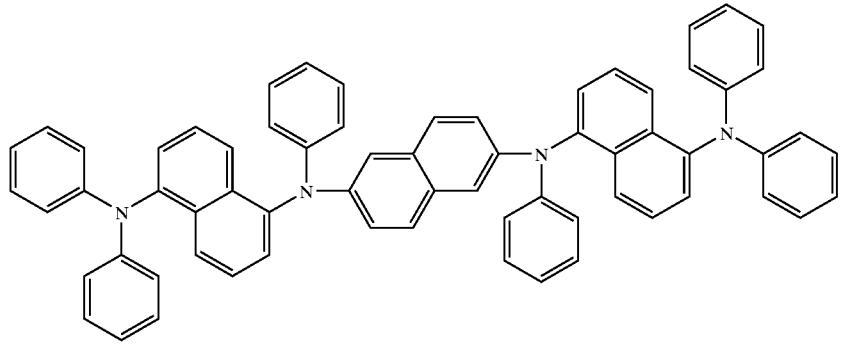
Inv-26
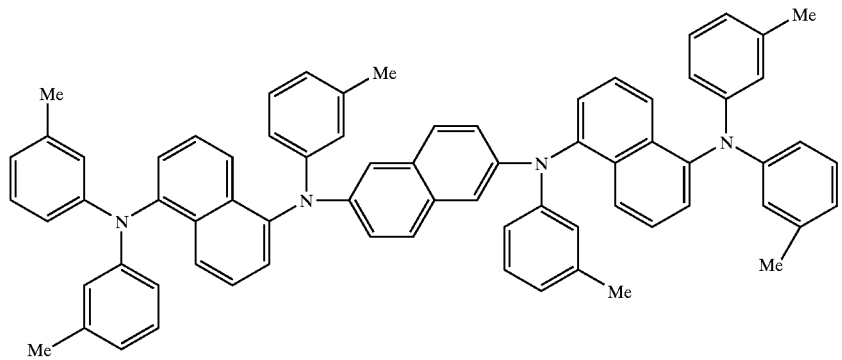
Inv-27
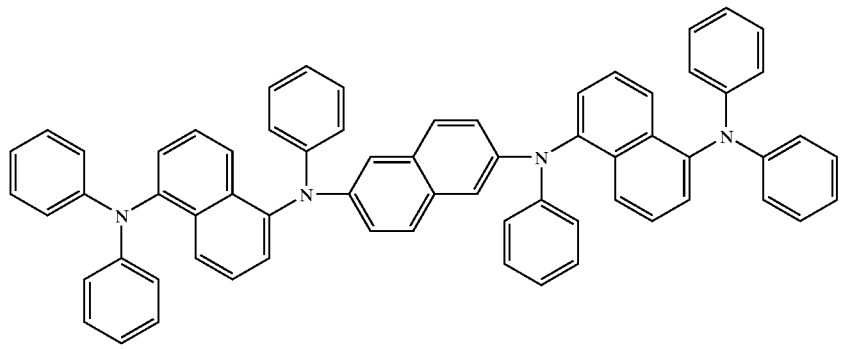
Inv-28
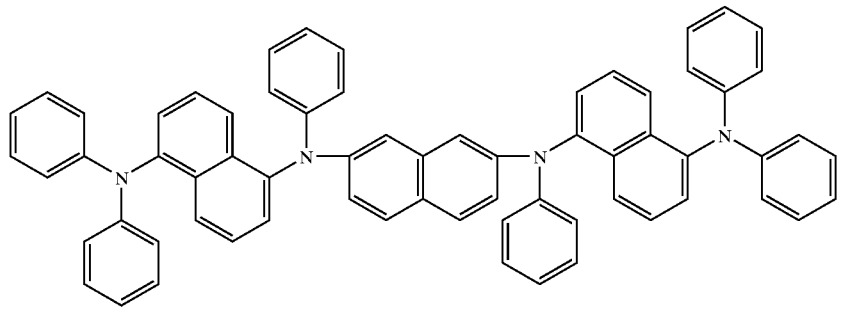
Inv-29

Inv-30
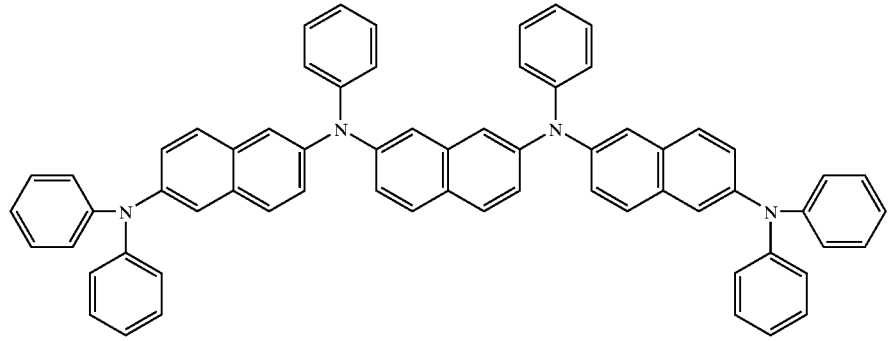
Inv-31
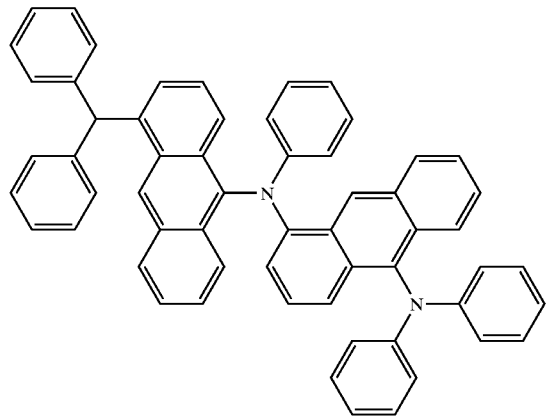
Inv-32
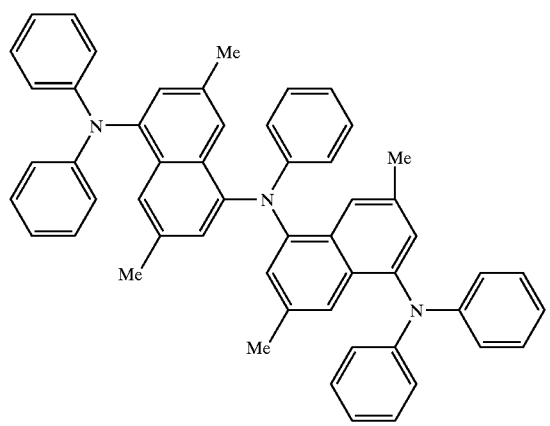

Inv-33

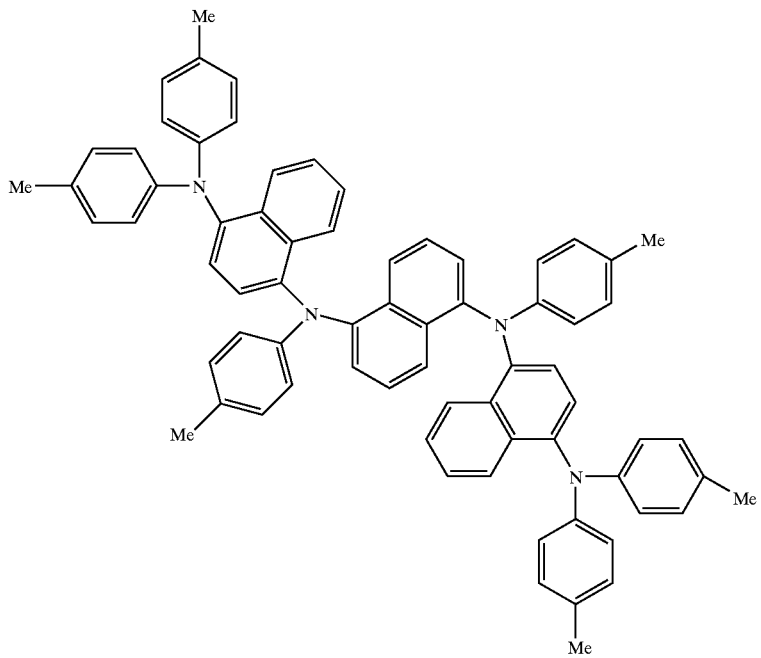

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, or sulfur. The substituent may be, for example, halogen, such as chlorine, bromine or fluorine; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy) propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy) butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl) carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecy-loxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsul-fonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dode-cylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen and sulfur, such as 2-furyl, 2-thienyl, 2-benzimidazolyloxy or 2-benzothiazolyl; quaternary ammonium, such as triethylammonium; and silyloxy, such as trimethylsilyloxy.

If desired, the substituents may themselves be further substituted one or more times with the described substituent groups. The particular substituents used may be selected by those skilled in the art to attain the desired properties for a specific application.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT). The total combined thickness of the organic layers is preferably less than 500 nm.

Figure 2:
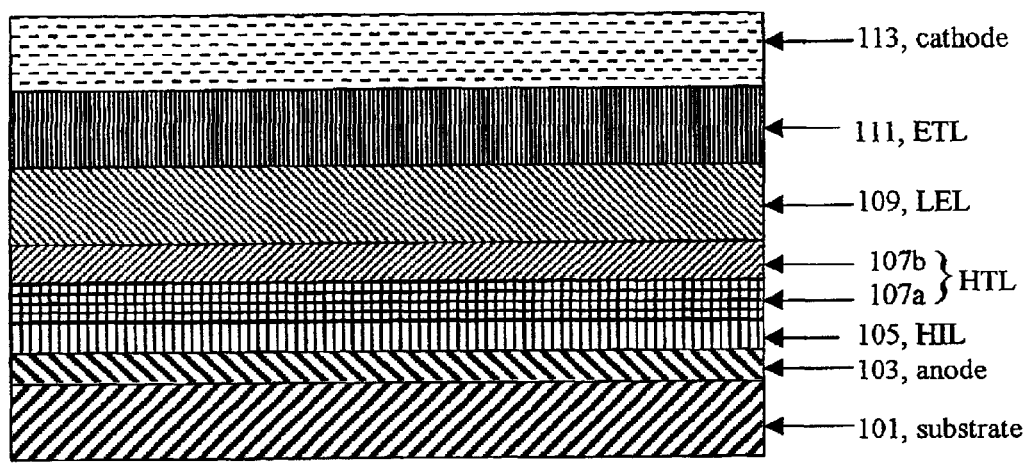
FIG. 2 is a schematic diagram showing a cross-section of a second organic EL device of the invention.

There are numerous configurations of the organic layers wherein the present invention can be successfully practiced. The compound of Formula (1) can be used wherever a hole transport material is called for. A typical structure is shown in FIG. 1 and is comprised of a substrate 101, an anode layer 103, an optional hole-injecting layer 105, a hole-transporting layer 107, a light-emitting layer 109, an electron-transporting layer 111, and a cathode layer 113. These layers are described in detail below. FIG. 2 shows a variation of this embodiment in which there are employed two hole-transporting sub-layers, 107a and 107b.

Substrate

The substrate 101 can either be light transmissive or opaque, depending on the intended direction of light emission. The light transmissive property is desirable for viewing the EL emission through the substrate. The transparent substrate may contain, or have built up on it, various electronic structures or circuitry (e.g., low temperature polysilicon TFT structures) so long as a transparent region or regions remain. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course it is necessary to provide in these device configurations a light transparent top electrode. The substrate, in some cases, may actually constitute the anode or cathode Anode The conductive anode layer 103 is formed over the substrate and, when EL emission is viewed through the anode, should be transparent or substantially transparent to the emission of interest. Common transparent anode materials used in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. For applications where EL emission is viewed through the top electrode, the transmissive characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

While not always necessary, it is often useful that a hole-injecting layer 105 be provided adjacent to the anode 103 and between the anode and the hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers (CFx) as described in U.S. Pat. No. 6,208,075. Alternative hole-injecting materials reportedly useful in organic EL devices are described in EP 0 891 121 A1 and EP 1,029,909 A1. It is possible to employ materials useful in the invention in addition to the foregoing materials.

Hole-Transporting Layer (HTL)

In a desirable embodiment of this invention, the hole-transporting layer 107 (or layers 107a and 107b) of the organic EL device contains at least one compound described in Formula (1). While the naphthalene compound of Formula (1) can be used alone as the HTL material, a useful embodiment is to use two HTL materials preferably where the layer 107 is divided into two regions or sub layers, 107a and 107b, as shown in FIG. 2. The naphthalene compound of Formula (1) can be used in either or both layers, but it is preferred if it is at least used in layer 107a, closer to the anode.

Other HTL materials described below can be used in combination with Formula (1) as a mixture in layer 107, or as a discrete material or mixture in layers 107a or 107b. One useful class of hole-transporting compounds are aromatic tertiary amines, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (C).

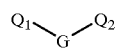

C wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., anaphthalene. When G is an aryl group, it is conveniently a phenylene, biphenylene, or naphthalene moiety.

A useful class of triarylamines satisfying structural formula (C) and containing two triarylamine moieties is represented by structural formula (D):

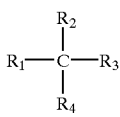

where

R$_1$ and R$_2$ each independently represents a hydrogen atom, an aryl group, or an alkyl group or R$_1$ and R$_2$ together represent the atoms completing a cycloalkyl group; and R$_3$ and R$_4$ each independently represents an aryl group, which is in turn substituted with a diaryl substituted amino group, as indicated by structural formula (E):

wherein R$_5$ and R$_6$ are independently selected aryl groups. In one embodiment, at least one of R$_5$ or R$_6$ contains a polycyclic fused ring structure, e.g., a naphthalene.

Another class of aromatic tertiary amines are the tetraaryldiamines. Desirable tetraaryldiamines include two diarylamino groups, such as indicated by formula (E), linked through an arylene group. Useful tetraaryldiamines include those represented by formula (F).

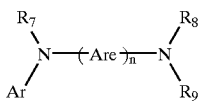

wherein
each Are is an independently selected arylene group, such as a phenylene or anthracene moiety;
n is an integer of from 1 to 4; and
Ar, R$_7$, R$_8$, and R$_9$ are independently selected aryl groups. In a typical embodiment, at least one of Ar, R$_7$, R$_8$, and R$^9$ is a polycyclic fused ring structure, e.g., a naphthalene The various alkyl, alkylene, aryl, and arylene moieties of the foregoing structural formulae (C), (D), (E), (F), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethyl amino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4–4'-diaminobiphenyl
N,N,N',N'-Tetraphenyl-4,4'-diaminobiphenyl
N-Phenylcarbazole
Poly(N-vinylcarbazole), and
N,N'4-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl "NPB"
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
[1,1'-Biphenyl]4,4'-diamine,N,N'-di-1-naphthalenyl-N,N'-di-2-naphthalenyl.

Light-Emitting Layer (LEL)

As more fully described in U.S. Pat. Nos. 4,769,292 and 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, a mixture of hole- and electron-transporting materials, or another material or mixture that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar derivatives (Formula G) constitute one class of useful host compounds capable of supporting electroluminescence, and are particularly suitable for light emission of wavelengths longer than 500 nm, e.g., green, yellow, orange, and red.

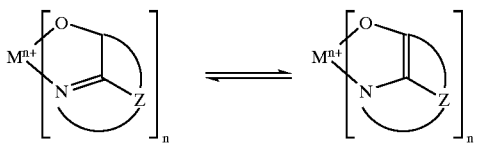

wherein

M represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis [benzo{f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]

CO-7: Lithium oxine [alias, (8-quinolinolato)lithium(I)]

Derivatives of 9,10-di-(2-naphthyl)anthracene (Formula H) constitute one class of useful hosts capable of supporting electroluminescence, and are particularly suitable for light emission of wavelengths longer than 400 nm, e.g., blue, green, yellow, orange or red.

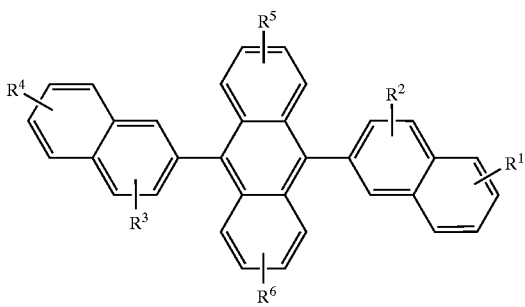

wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula (I)) constitute another class of useful hosts capable of supporting electroluminescence, and are particularly suitable for light emission of wavelengths longer than 400 nm, e.g., blue, green, yellow, orange or red.

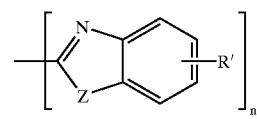

Where:

N is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;

B is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris [1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful luminescent dopants include, but are not limited to, the following:

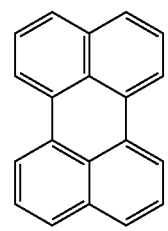

-continued
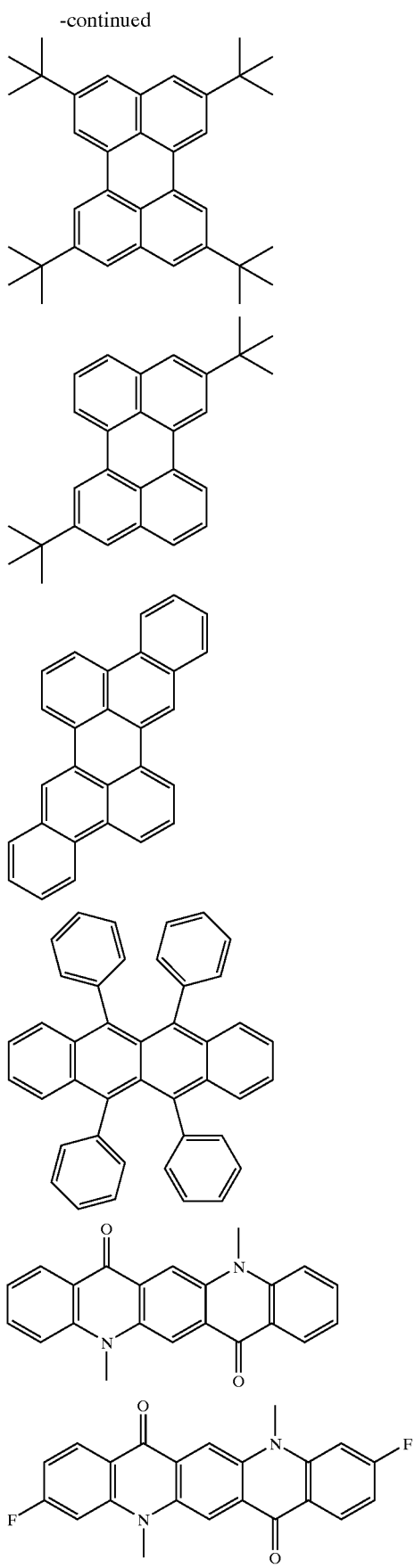
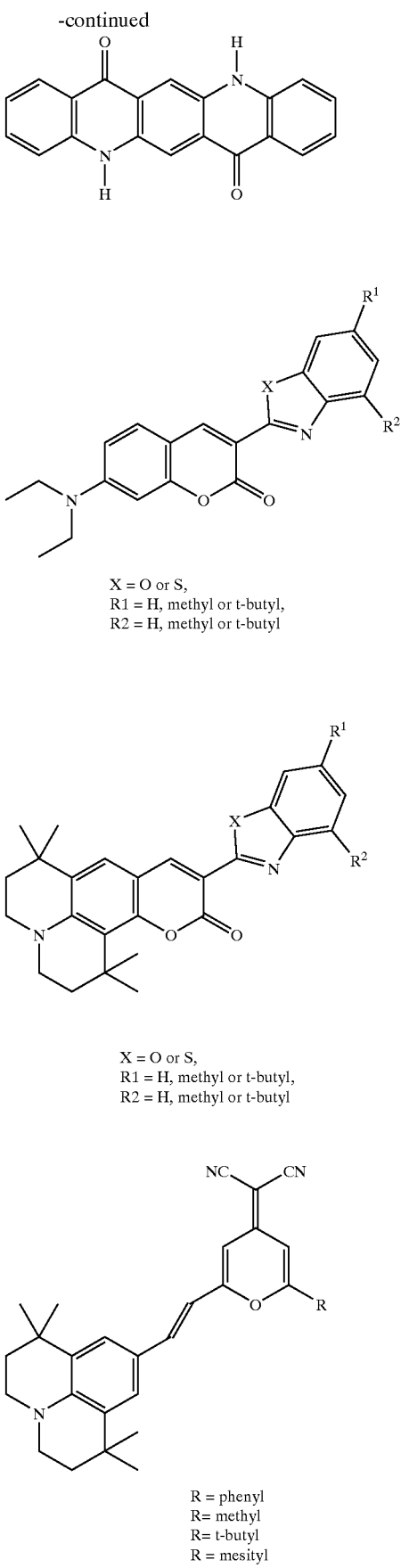
X = O or S,
R1 = H, methyl or t-butyl,
R2 = H, methyl or t-butyl
X = O or S,
R1 = H, methyl or t-butyl,
R2 = H, methyl or t-butyl
R = phenyl
R= methyl
R= t-butyl
R = mesityl -continued

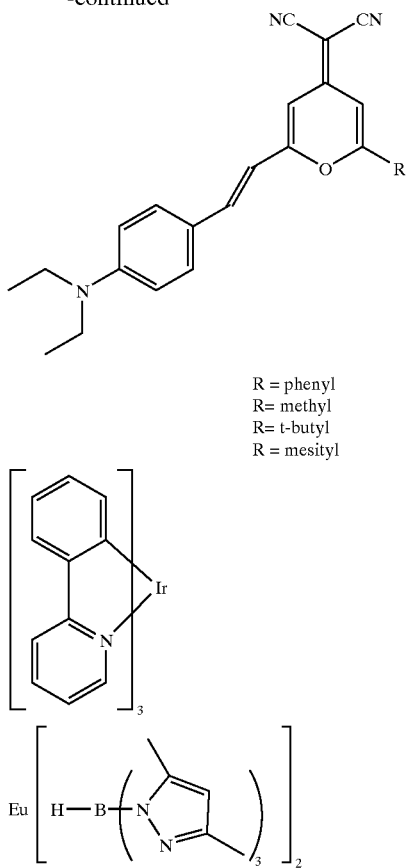

R = phenyl
R = methyl
R = t-butyl
R = mesityl

Electron-Transporting Layer (ETL)

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (G), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (I) are also useful electron transporting materials.

In some instances, layers 109 and 111 can optionally be collapsed into a single layer that serves the function of supporting both light emission and electron transportation.

Cathode

When light emission is through the anode, the cathode layer 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially defined thermal dye transfer from a donor sheet (U.S. Pat. Nos. 5,851,709 and 6,066,357) and inkjet method (U.S. Pat. No. 6,066,357).

Encapsulation

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

The entire contents of the patents and other publications referred to in this specification are incorporated herein by reference.

EXAMPLES

The invention and its advantages are further illustrated by the specific examples which follow.

Synthesis

Example 1

Preparation of N,N'-Diphenyl-1,5-diaminonaphthalene 1,5-Diaminonaphthalene (2.5 g, 15.8 mmol) was combined with iodobenzene (7.1 g, 34.8 mmol), palladium diacetate (100 mg, 0.5 mmol), tri-t-butylphosphine (0.3 mL), sodium t-butoxide (4.0 g, 41.6 mmol), and toluene (60 mL). The mixture was heated at 110° C. with magnetic stirring under a nitrogen atmosphere. After 2 h, an additional amount of palladium diacetate (100 mg, 0.5 mmol) was added. After heating for another 2 h, the heat was removed.

After cooling to room temperature, the solid present was collected and washed with acetone. The solid was combined with hot acetone (150 mL) and the solution was filtered. The product precipitated on cooling (1.3 g, 26%).

Preparation of Compound 1 (Inv-1): N,N'-Diphenyl-1,5-diaminonaphthalene (1.5 g, 4.8 mmol), 4-bromo-N,N-di-p-tolylaniline (3.4 g, 9.7 mmol), palladium diacetate (150 mg, 0.7 mmol), tri-t-butylphosphine (0.6 mL), sodium t-butoxide (1.1 g, 11.5 mmol), and xylene (75 mL) were combined and heated to 130° C. for 2 h with magnetic stirring under a nitrogen atmosphere. The heat was removed and after cooling to room temperature the reaction mixture was filtered. The filtrate was evaporated and the resulting solid was combined with ethyl acetate (75 mL) and the mixture was heated to reflux and stirred for 45 min. After cooling, the product was collected (3.3 g, 80% yield). A portion of the product (1.65 g) was sublimed twice (335–340° C., $6 \times 10^{-1}$ torr) affording 0.66 g of an amorphous solid. The Tg of this material was 124° C.

b) A first layer of Compound 1 (Inv-1, see Table 1 for layer thickness) was then deposited over the CFx by evaporation from a tantalum boat.

c) A hole-transporting layer of N,N'-di-1-naphthalenyl-N, N'-diphenyl-4, 4'-diaminobiphenyl (NPB, see Table 1 for layer thickness), was then evaporated from a tantalum boat.

d) A 75 nm light-emitting/electron transport layer of tris(8-quinolinolato)aluminum (III) (AlQ$_3$) was then deposited onto the hole-transporting layer. This material was also evaporated from a tantalum boat.

e) On top of the AlQ$_3$ layer was deposited a 220 nm cathode formed of a 10:1 atomic ratio of Mg and Ag.

A comparison device was prepared omitting layer b) and containing an overall hole-transporting layer thickness substantially the same as the other examples.

The cells thus formed were tested for luminance with a constant current of 20 mA/cm$^2$ and the results are reported in Table I. It can be seen from Table I that the compounds useful in the invention, when incorporated into EL cells, give an increase in luminance of 30–40% compared to the check comparison.

TABLE I

Evaluation Results for Compound 1 (Inv-1).

| Example | Type | Compound 1 (Inv-1) Layer b) Thickness (nm) | Compound NPB Layer c) Thickness (nm) | Cell Luminance (candela/m$^2$) | Relative Luminance (%) |
|---|---|---|---|---|---|
| 3-1 | Comparison | 0.0 | 75.0 | 512 | 100 |
| 3-2 | Invention | 5.2 | 70.3 | 682 | 133 |
| 3-3 | Invention | 20.1 | 55.0 | 668 | 130 |
| 3-4 | Invention | 55.0 | 20.0 | 716 | 140 |
| 3-5 | Invention | 70.0 | 5.2 | 718 | 140 |
| 3-6 | Invention | 75.1 | 0.0 | 377 | 74 |

Example 2

Preparation of Compound 2 (Inv-2)

N,N'-Diphenyl-1,5-diaminonaphthalene (1.55 g, 5.0 mmol), 4-bromo-N,N-diphenylaniline (3.24 g, 10.0 mmol), palladium diacetate (150 mg, 0.7 mmol), tri-t-butylphosphine (0.6 mL), sodium t-butoxide (1.1 g, 11.5 mmol), and xylene (75 mL) were combined and heated to 130° C. for 2.5 h with magnetic stirring under a nitrogen atmosphere. The heat was removed and after cooling to room temperature the reaction mixture was filtered. The filtrate was evaporated and the resulting solid was purified by column chromatography (silica gel, 30% dichloromethane, 70% heptane) and sublimed (355° C., $6 \times 10^{-1}$ torr) affording 1.6 g of product (40% yield). The Tg of this material was 119° C.

Example 3

EL Device Fabrication and Performance

A series of EL devices satisfying the requirements of the invention were constructed in the following manner:

A glass substrate coated with an 42 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon hole-injecting layer (CFx) by plasma-assisted deposition of CHF$_3$.

It is noted that Sample 3–6 provides useful luminance although not as good as the previously known NPB compound. Moreover, when used in combination with the NPB compound, superior results are obtained compared to the use of NPB or the naphthalene compound alone.

Example 4

EL Device Fabrication and Performance using Compound 2 (Inv-2)

A series of EL devices were prepared as described in Example 3, except the ITO thickness was 85nm and CFx plasma treatment was omitted. Compound 2 (Inv-2) in layer b) was used as the hole-injecting material and the thickness of layers b) and c) is given in Table II. The cells thus formed were tested for luminance with a constant current of 20 mA/cm$^2$ and the results are also reported in Table II.

TABLE II

Evaluation Results for Compound 2 (Inv-2).

| Example | Type | Compound 2 (Inv-2) Layer b) Thickness (nm) | Compound NPB Layer c) Thickness (nm) | Cell Luminance (candela/m$^2$) | Relative Luminance |
|---|---|---|---|---|---|
| 4-1 | Comparison | 0.0 | 75.3 | 675 | 100 |
| 4-2 | Invention | 5.0 | 70.1 | 828 | 123 |
| 4-3 | Invention | 70.2 | 5.3 | 851 | 126 |

The addition of the naphthalene compound provided improved luminance.

Example 5

EL Device Fabrication and Performance Using a Dopant

A series of EL devices were prepared as described in Example 4. Compound 2 (Inv-2) was used as the hole injecting material and the thickness of the hole injecting layer is given in Table III. A green fluorescent dopant, D-1, was co-deposited in the AlQ$_3$ layer (d) at a level of 1%. The cells thus formed were tested for luminance with a constant current of 20 mA/cm$^2$ and the results are also reported in Table III. The EL color of the cells was green with average 1931 CIE color coordinates of x=0.328 and y=0.627. The EL spectra indicate that the green EL emission originates from the dopant in the AlQ$_3$ layer. Cells containing Compound 2 (Inv-2) gave improved luminance.

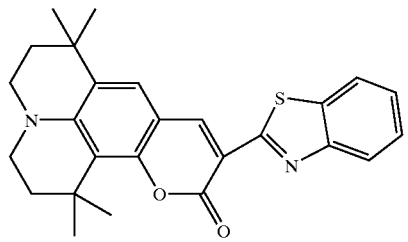

D-1

TABLE III

Evaluation Results for Compound 2 (Inv-2) and a Green Dopant.

| Example | Type | Compound 2 (Inv-2) Layer Thickness (nm) | Compound NPB Layer Thickness (nm) | Cell Luminance (candela/m$^2$) | Relative Luminance |
|---|---|---|---|---|---|
| 5-1 | Comparison | 0.0 | 75.1 | 1799 | 100 |
| 5-2 | Invention | 5.0 | 70.1 | 2222 | 123 |
| 5-3 | Invention | 70.0 | 5.0 | 2359 | 131 |

Example 6

Preparation of N,N,N'-Triphenyl-1,5-diaminonaphthalene 1,5-Diaminonaphthalene (16.0 g, 0.101 mol) was combined with bromobenzene (47.1 g, 0.300 mol), palladium diacetate (1.2 g, 0.004 mol), tri-t-butylphosphine (4 mL), sodium t-butoxide (24.0 g, 0.26 mol), and xylene (400 mL). The mixture was heated at 140° C. with magnetic stirring under a nitrogen atmosphere. After 15 h, an additional amount of palladium diacetate (0.100 g, 0.0004 mol) was added. After heating for another 6 h, an additional amount of palladium diacetate (0.100 g, 0.0004 mol) was added. After heating for another 15 h the heat was removed. After cooling to room temperature, the solid present was filtered off and the filtrate was purified by column chromatography. This afforded 6.0 g (15% yield) of N,N,N'-triphenyl-1,5-diaminonaphthalene.

Preparation of Compound Inv-18: N,N,N'-Triphenyl-1,5-diaminonaphthalene (1.0 g, 2.5 mmol), 1,5-dibromonapthalene (0.4 g, 1.4 mmol), palladium diacetate (100 mg, 0.4 mmol), tri-t-butylphosphine (0.4 mL), sodium t-butoxide (0.3 g, 3.3 mmol), and toluene (30 mL) were combined and heated to 110° C. for 6 h with magnetic stirring under a nitrogen atmosphere. The solid formed was collected and washed with toluene and dried. The product was sublimed twice (390° C., 0.25 torr) affording 0.620 g (53% yield) of an amorphous solid, mass spectrum: m/e=896 (M−1).

Example 7

EL Device Fabrication and Performance

A series of EL devices satisfying the requirements of the invention were constructed in the following manner:

A glass substrate coated with an 42 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon hole-injecting layer (CFx) by plasma-assisted deposition of CHF$_3$.

b) A first layer of Inv-18 (see Table IV for layer thickness) was then deposited over the CFx by evaporation from a tantalum boat.

c) A hole-transporting layer of N,N'-di-1-naphthalenyl-N,N'-diphenyl-4,4'-diaminobiphenyl (NPB, see Table IV for layer thickness), was then evaporated from a tantalum boat.

d) A 75 nm light-emitting/electron transport layer of tris(8-quinolinolato)aluminum (III) (AlQ$_3$) was then deposited onto the hole-transporting layer. This material was also evaporated from a tantalum boat.

e) On top of the AlQ$_3$ layer was deposited a 220 nm cathode formed of a 10:1 atomic ratio of Mg and Ag.

A comparison device was prepared omitting layer b) and containing an overall hole-transporting layer thickness substantially the same as the other examples.

The cells thus formed were tested for luminance with a constant current of 20 mA/cm$^2$ and the results are reported in Table IV. It can be seen from Table IV that the compounds useful in the invention, when incorporated into EL cells, give an increase in luminance compared to the check comparison.

TABLE IV

Evaluation Results for Compound Inv-18.

| Example | Type | Compound Inv-18 (Layer b) Thickness (nm) | Compound NPB (Layer c) Thickness (nm) | Cell Luminance (candela/m$^2$) | Relative Luminance (%) |
|---|---|---|---|---|---|
| 3-1 | Comparison | 0.0 | 75.0 | 534 | 100 |
| 3-2 | Invention | 5.2 | 70.3 | 550 | 103 |
| 3-3 | Invention | 20.1 | 55.0 | 702 | 132 |
| 3-4 | Invention | 55.0 | 20.0 | 784 | 147 |
| 3-5 | Invention | 70.0 | 5.2 | 784 | 147 |
| 3-6 | Invention | 75.1 | 0.0 | 663 | 124 |

The invention has been described in detail with particular reference to certain preferred embodiments thereof, but it will be understood that variations and modifications can be effected within the spirit and scope of the invention.

PARTS LIST

101 Substrate
103 Anode
105 Hole-Injecting layer (HIL)
107 Hole-Transporting layer (HTL)
107a Hole-Transporting sub layer closer to anode
107b Hole-Transporting sub layer further from anode.
109 Light-Emitting layer (LEL)
111 Electron-Transporting layer (ETL)
113 Cathode

What is claimed is:

1. A multilayer electroluminescent device comprising a cathode, an anode, a light emitting layer (LEL) and a layer disposed between the cathode and anode containing a naphthalene compound represented by formula (1):

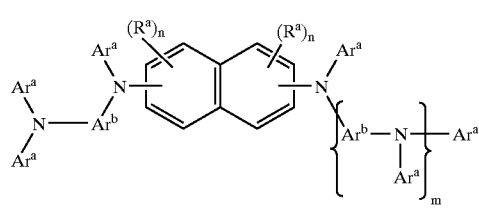

wherein m is 0, 1 or 2;

each $R^a$ is an independently selected substituent and each n is independently 0 to 3;

each $Ar^a$ is an independently selected aromatic group; and
each $Ar^b$ is a phenyl or naphthyl group;
provided that two ring substituents do not join to form a ring.

2. The device of claim 1 wherein m is 0.
3. The device of claim 1 wherein m is 1.
4. The device of claim 1 wherein m is 2.
5. The device of claim 1 wherein the naphthalene compound is a 1,5-diamino compound.
6. The device of claim 1 wherein the naphthalene compound is a 2,6 diamino compound.
7. The device of claim 1 wherein at least one $R^a$ group is an alkyl or aryl group.
8. The device of claim 7 wherein at least one $R^a$ is a methyl group.
9. The device of claim 1 wherein at least one $Ar^a$ is a phenyl or heteroaromatic group.
10. The device of claim 1 wherein at least one $Ar^6$ is a para-substituted phenyl group.
11. The device of claim 1 wherein the LEL contains a metal complex of a quinoline derivative.
12. The device of claim 11 wherein the LEL contains tris(8-quinolinolato)aluminum (III) (AlQ$_3$).
13. The device of claim 1 wherein the LEL contains a compound having the formula:

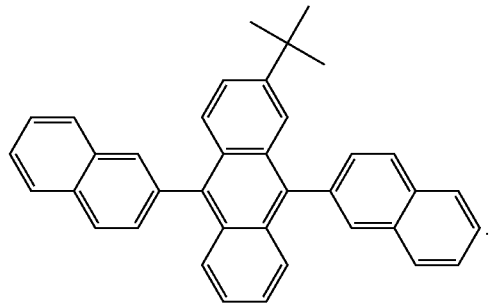

14. The device of claim 1 wherein the naphthalene compound is represented by formula (1A):

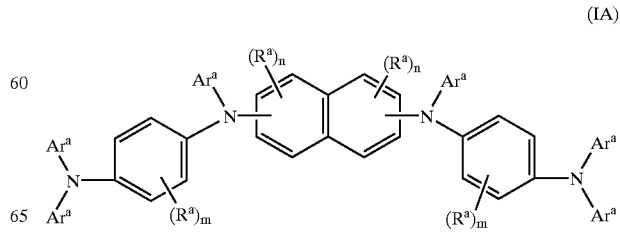

wherein
each $Ar^a$, $R^a$, and n are as defined in claim 1 and each m is independently 0–4.

15. The device of claim 1 wherein the naphthalene compound is represented by formula (1B):

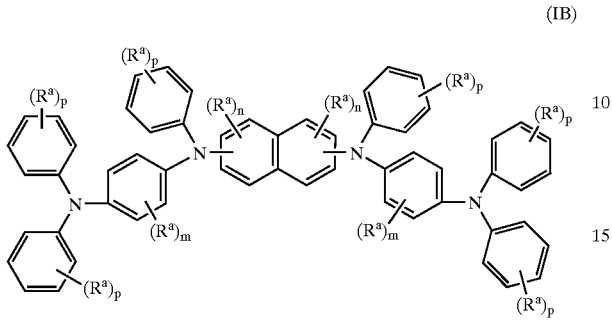

(IB)

wherein
each $R^a$ and n is as defined in claim 1, each m is 0–4, and each p is independently 0–5.

16. The device of claim 1 wherein the naphthalene compound is contained in a layer that is adjacent to the anode.

17. The device of claim 1 wherein the naphthalene compound is contained in a layer that is not adjacent to the anode.

18. The device of claim 1 wherein the naphthalene compound is contained in a layer that is not adjacent to the LEL.

19. The device of claim 1 wherein the naphthalene compound functions to improve hole-transporting and there is present in a layer between the anode and LEL a second compound that functions to improve hole transporting.

20. The device of claim 19 wherein the second compound is represented by structural formula (C):

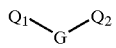

C wherein $Q_1$ and $Q_2$ are independently selected aromatic tertiary amine moieties and G is a linking group or a bond.

21. The device of claim 20 wherein the compound of formula C is contained in the layer adjacent to the LEL.

22. The device of claim 20 wherein the second compound is 4,4'-Bis[N-(2-naphthyl)-N-phenylamino]biphenyl or [1,1'-Biphenyl]-4,4'-diamine,N,N'-di-1-naphthalenyl-N,N'-di-2-naphthalenyl.

23. The device of claim 1 containing in the LEL the compound tris(8-quinolinolato) aluminum (III) or a compound represented by the formula:

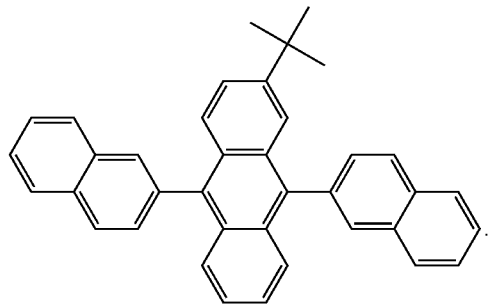

24. A naphthalene compound represented by formula (1):

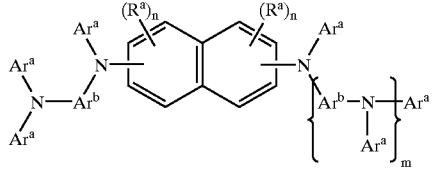

(1)

wherein m is 0, 1 or 2;

each $R^a$ is an independently selected substituent and each n is independently 0 to 3;

each $Ar^a$ is an independently selected aromatic group; and each $Ar^b$ is an independently selected phenyl or naphthyl group;

provided that two ring substituents do not join to form a ring; and the nitrogen substituents of the naphthalene compound are located so as to form a 1,5- or 2,6-diamino compound.

25. A static or motion imaging device incorporating the device of claim 1.

* * * * *